(12) United States Patent
Choe (10) Patent No.: US 8,885,392 B1
(45) Date of Patent: Nov. 11, 2014

(54) RAM/ROM MEMORY CIRCUIT

(75) Inventor: Kok Heng Choe, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/395,589

(22) Filed: Feb. 27, 2009

(51) Int. Cl.
*G11C 11/00* (2006.01)

(52) U.S. Cl.
USPC .......................... 365/154; 365/96; 365/225.7

(58) Field of Classification Search
CPC ........... G11C 11/5692; G11C 11/5614; G11C 13/0011; G11C 14/0054; G11C 11/41; G11C 11/412
USPC ........ 365/94, 96 X, 154 O, 225.7 X, 96, 154, 365/225.7
See application file for complete search history.

(56) References Cited

U.S. PATENT DOCUMENTS

| | | | | |
|---|---|---|---|---|
| 5,426,614 | A * | 6/1995 | Harward | 365/225.7 |
| 6,717,842 | B2 * | 4/2004 | Watanabe et al. | 365/154 |
| 7,376,028 | B2 * | 5/2008 | Tokito | 365/203 |
| 7,388,273 | B2 * | 6/2008 | Burr et al. | 257/529 |
| 7,609,578 | B2 * | 10/2009 | Buer et al. | 365/225.7 |
| 7,760,538 | B1 * | 7/2010 | Paak | 365/148 |
| 2005/0190597 | A1 * | 9/2005 | Kato | 365/185.08 |
| 2007/0109895 | A1 * | 5/2007 | Tokito | 365/210 |

OTHER PUBLICATIONS

Digital Design by M. Morris Mano, second edition, pp. 425 and 428.*

* cited by examiner

*Primary Examiner* — Vanthu Nguyen
(74) *Attorney, Agent, or Firm* — Womble, Carlyle, Sandridge & Rice (57) ABSTRACT

A configurable memory circuit is provided. The memory circuit includes an inverter coupled to another inverter as back-to-back inverters. A programmable switch is placed on each side of the memory circuit. The programmable switches are used to configure the memory circuit. The memory circuit, depending on the configuration of the programmable switches and the back-to-back inverters, may operate as a ROM that stores a logic high value, a ROM that stores a logic low value, or a RAM.

20 Claims, 10 Drawing Sheets

RAM/ROM MEMORY CIRCUIT

BACKGROUND

The present invention relates generally to integrated circuits (ICs) and more specifically to memory circuits that support multiple memory modes.

Random access memory (RAM) and non-volatile memory like read-only memory (ROM) are used in a wide array of applications. Memory blocks or memory circuits in an integrated circuit device can be configured differently, i.e. either as a RAM or a ROM, based on a user's application. For instance, SRAM memory cells can be configured as ROM and be loaded with values during configuration of the integrated circuit device. These memory cells can then be configured to operate in read only mode during post-configuration operation of the device.

In some devices where the extra control circuitry needed to properly configure an SRAM as a ROM is removed, a programmable switch may be placed in between back-to-back inverters in the SRAM cell. During ROM mode, the switch could be connected either to a power supply or to a ground potential to force the SRAM cell to a fixed value. In RAM mode, the switch could complete the back-to-back connection of the SRAM cell. However, using a switch this way contributes to extra capacitance and resistance loading on one side of the SRAM cell that can potentially degrade the read and write margin of the SRAM cell. Consequently, the SRAM cell becomes more susceptible to noise and loading mismatch.

Therefore, it is advantageous to have a memory cell that can support both RAM and ROM modes and still improve, or at least not degrade, the read and write margin. It is also advantageous to have a memory cell that reduces current leakage in a reduced power consumption mode such as standby mode. It is further advantageous to have a substantially symmetrical memory circuit in order to reduce mismatch loading in the memory circuit and improve layout matching.

SUMMARY

Embodiments of the present invention include circuits and a process for creating a memory cell.

It should be appreciated that the present invention can be implemented in numerous ways, such as a process, an apparatus, a system, a device or a method on a computer readable medium. Several inventive embodiments of the present invention are described below.

In one embodiment, a memory circuit with two one-time programmable switches is disclosed. The memory circuit has a first inverter and a second inverter that form a first connection and a second connection to each other. The memory circuit also has two one-time programmable switches. A first one-time programmable switch is coupled to the first connection and a second one-time programmable switch is coupled to the second connection. In some embodiments, the memory circuit is configured to operate either as a read only memory or a random access memory.

In another embodiment, a memory circuit is provided. The memory circuit has two inverters. The two inverters are cross coupled to form two connections. Each of the two inverters includes a PMOS transistor coupled to an NMOS transistor. Gates of each pair of PMOS and NMOS transistors are coupled to each of the two connections respectively. The drain of the PMOS transistor and the source of the NMOS transistor in each of the two inverters are coupled to each of the two connections formed by the two inverters. The source of the PMOS transistor and the drain of the NMOS transistor in one inverter are coupled to one power level while the source of the PMOS transistor and the drain of the NMOS transistor in another inverter are coupled to a different power level. In other words, the transistors in each of the two inverters are coupled to a different power level.

In another embodiment in accordance with the present invention, a process for creating a read only memory circuit is described. The read only memory circuit has two inverters that are coupled to form two different connections to each other. A one-time programmable switch is coupled to each of the two connections. Both inverters are disconnected from a power source in the described process. Each of the one-time programmable switches coupled to the two connections is coupled to a different voltage level. The read only memory circuit stores a different logic value based on the voltage level coupled to each of the one-time programmable switches.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and a process for creating a memory circuit that supports multiple memory modes.

It will be obvious, however, to one skilled in the art, that the present invention may be practiced without some or all of these specific details. In other instances, well-known operations have not been described in detail in order not to unnecessarily obscure the present invention.

Figure 1A:
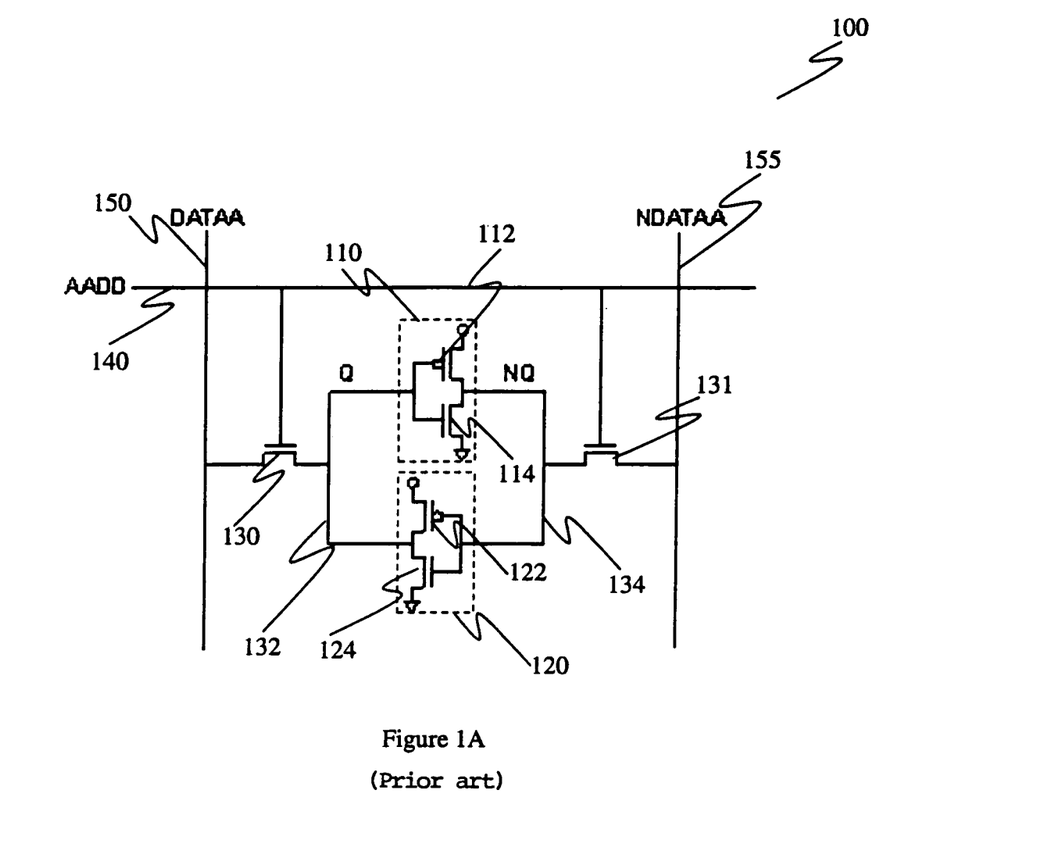
FIG. 1A shows a typical static random access memory (SRAM) circuit.

FIG. 1A shows a typical static random access memory (SRAM), memory circuit 100. Memory circuit 100 can be an embedded memory block in an integrated circuit device. Memory circuit 100 is formed by inverters 110 and 120. The first inverter, i.e., inverter 110, which may be referred to as a forward inverter, has a PMOS transistor 112 coupled to an NMOS transistor 114. PMOS transistor 112 is coupled to a power supply while NMOS transistor 114 is coupled to a ground potential. The second inverter, i.e., inverter 120, which may be referred to as a feedback inverter, has a PMOS transistor 122 coupled to an NMOS transistor 124. PMOS transistor 122 is coupled to a power supply and NMOS transistor 124 is coupled to a ground potential. The two inverters 110 and 120, make up a back-to-back inverter pair, also referred to as cross coupled inverters by those of skill in the art, that can hold different values in memory circuit 100. The values carried by inverters 110 and 120 pass through pass gates 130 and 131, respectively, on each side 132, 134 of the circuit 100. The line AADD 140 is a word line that carries the address of memory circuit 100. The line DATAA 150 is a bit line that carries a value stored in one side 132 of the memory circuit 100 and the line NDATAA 155 is a bit line that carries a complementary value stored in the other side 134 of the memory circuit 100.

Figure 1B:
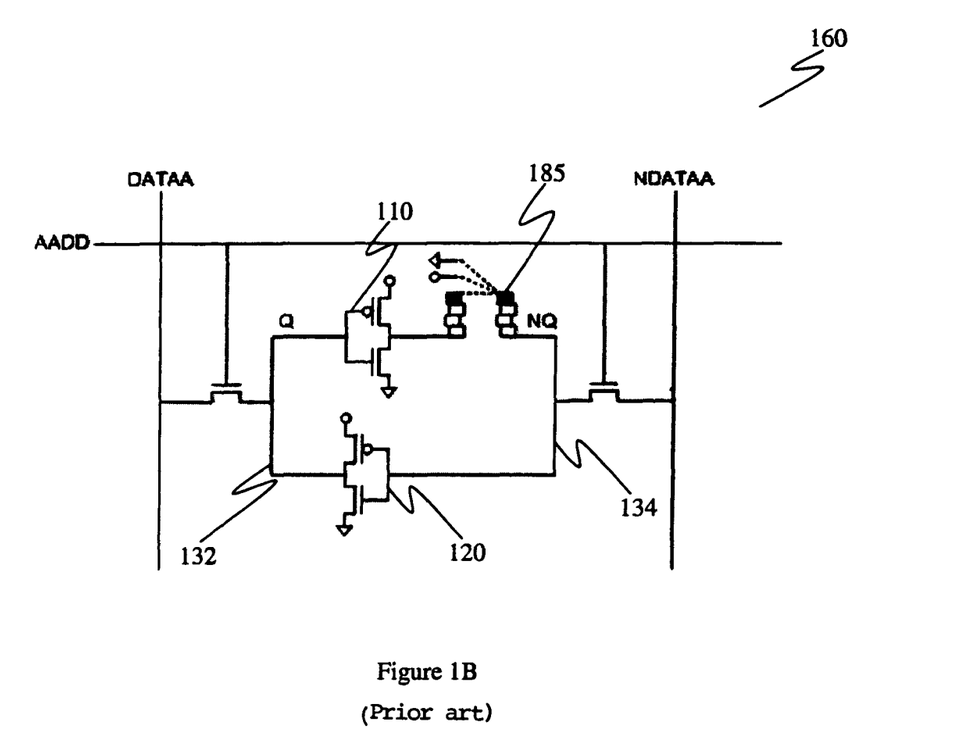
FIG. 1B is an example of an SRAM circuit with a metal programmable switch.

FIG. 1B is an example of another SRAM, memory circuit 160. It has similarities to memory circuit 100, but includes a metal programmable switch 185. Metal programmable switch 185 is coupled to forward inverter 110 and feedback inverter 120 on side 134 of memory circuit 160. Metal programmable switch 185 is connected to either VCC or GND depending on whether memory circuit 160 is used as a ROM to store a logic high value or a logic low value, respectively. In RAM mode, metal programmable switch 185 would complete the back-to-back connection on one side 134 of memory circuit 160. Metal programmable switch 185, as positioned in FIG. 1A, allows memory circuit 160 to be configured as a ROM or a RAM. However, metal programmable switch 185, placed on one side of the circuit 134, may cause loading mismatch due to the fact that the respective sides 132, 134 of memory circuit 160 would not be equal in size. In other words, memory circuit 160 is biased towards one side, i.e., side 134 of the back-to-back inverter, as there is extra capacitance and resistance loading on side 134 relative to the capacitance and resistance loading on side 132 of the SRAM cell. Thus, memory circuit 160, while able to support both RAM and ROM modes, is more susceptible to noise and is less robust than some of the embodiments described below due to the unbalanced capacitance and resistance loading of sides 132 and 134.

Figure 2:
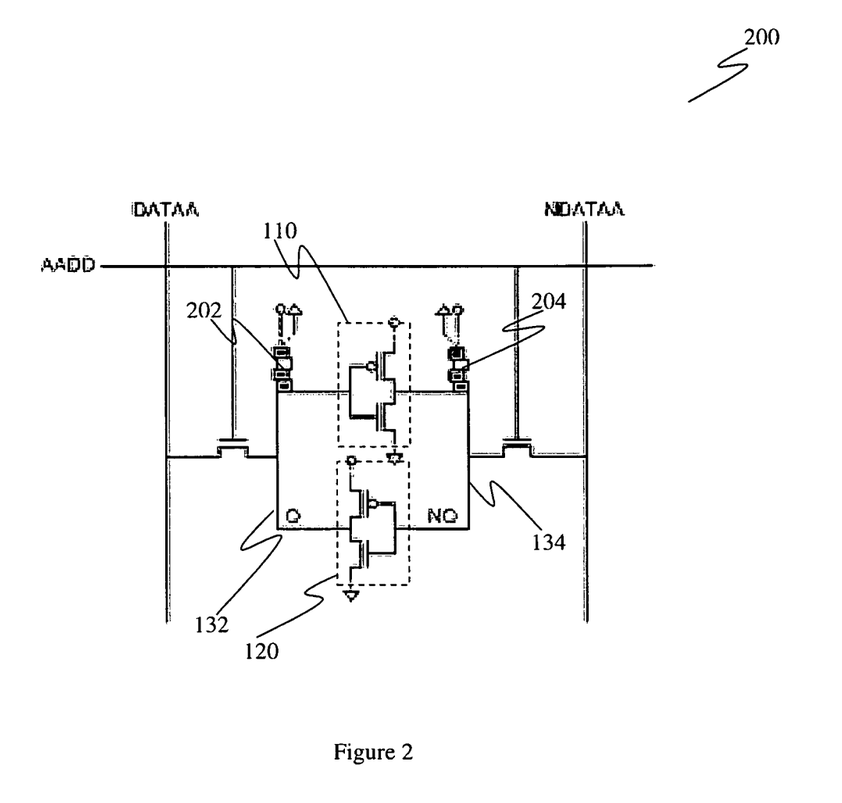
FIG. 2, meant to be illustrative and not limiting, shows a memory circuit with an independent pair of via switches on each side of the memory circuit in accordance with an embodiment of the present invention.

FIG. 2, meant to be illustrative and not limiting, shows memory circuit 200 with an independent pair of via switches 202, 204 on each side 132, 134 of memory circuit 200 in accordance with an embodiment of the present invention. Although via switches 202 and 204 are shown, one skilled in the art should appreciate that alternative switches known in the art may be integrated with the embodiment described herein. In addition, the switches may be programmable, i.e., resettable, or one time programmable, such as fuses, antifuses, polyfuses, etc. Placing one via switch on each side 132, 134 produces a memory circuit 200 with a symmetrical layout. A more symmetrical layout reduces capacitance and loading mismatch and, therefore, improves the read and write margin of memory circuit 200. FIG. 2 shows possible connections for first and second inverters 110, 120 and via switches 202, 204. First inverter 110, second inverter 120, and via switches 202, 204 can either be connected to a power supply or a ground potential or disconnected from power based on the configuration of memory circuit 200, details of which will be described in the subsequent paragraphs.

Figure 3A:
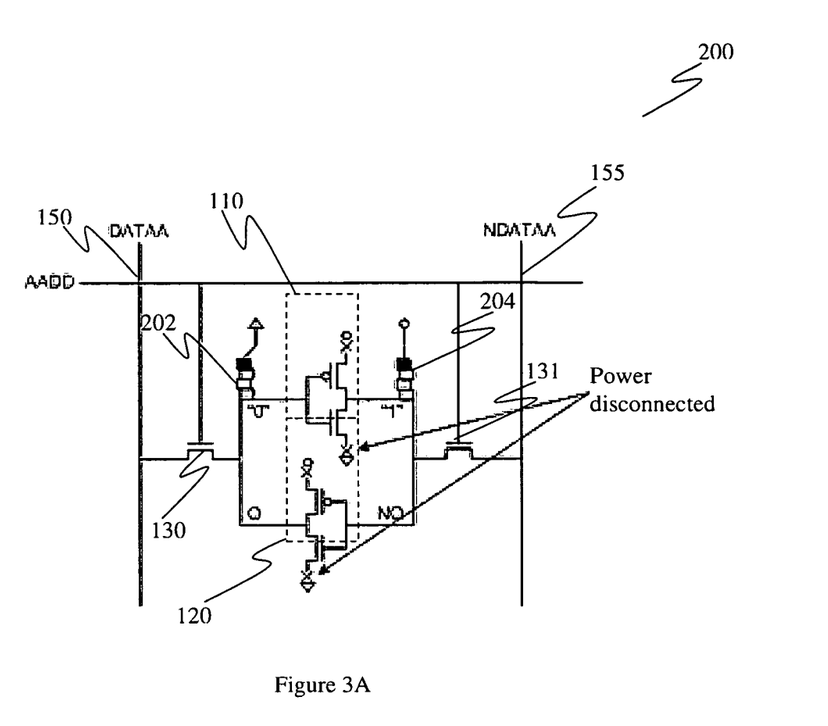
FIG. 3A, meant to be illustrative and not limiting, shows a memory circuit configured as a ROM storing a logic low value as an exemplary embodiment.
Figure 3B:
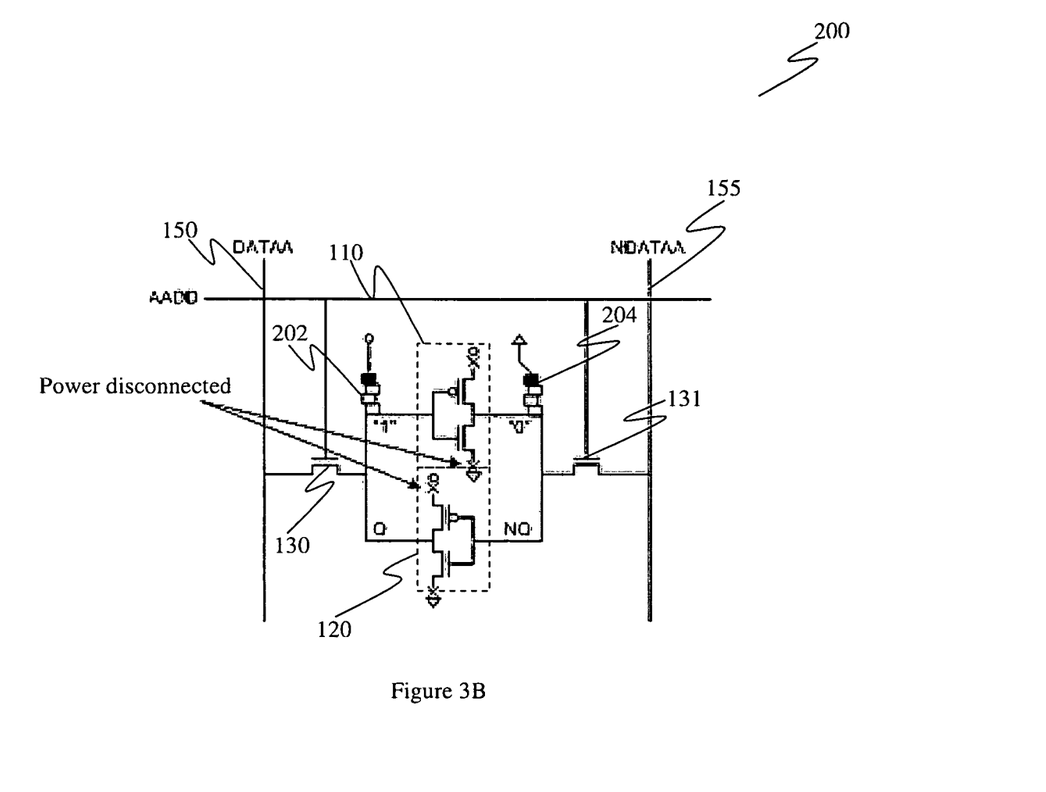
FIG. 3B, meant to be illustrative and not limiting, shows a memory circuit configured as a ROM storing a logic high value as an exemplary embodiment.
Figure 5A:
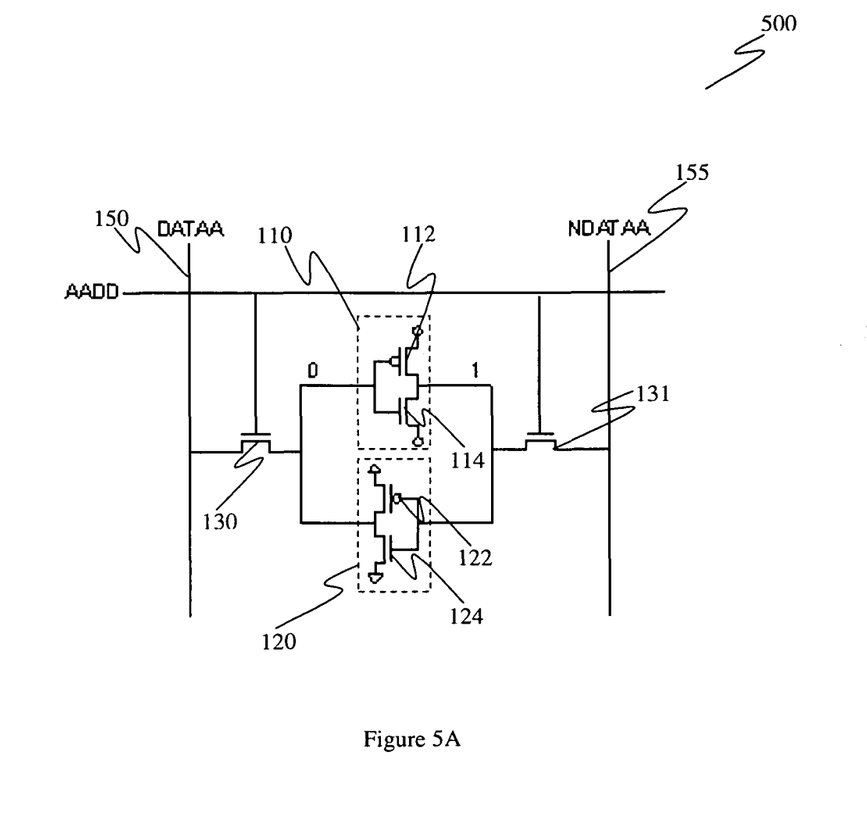
FIG. 5A, meant to be illustrative and not limiting, shows a memory circuit configured as a ROM storing a logic low value without using a pair of programmable switches as another embodiment of the present invention.
Figure 5B:
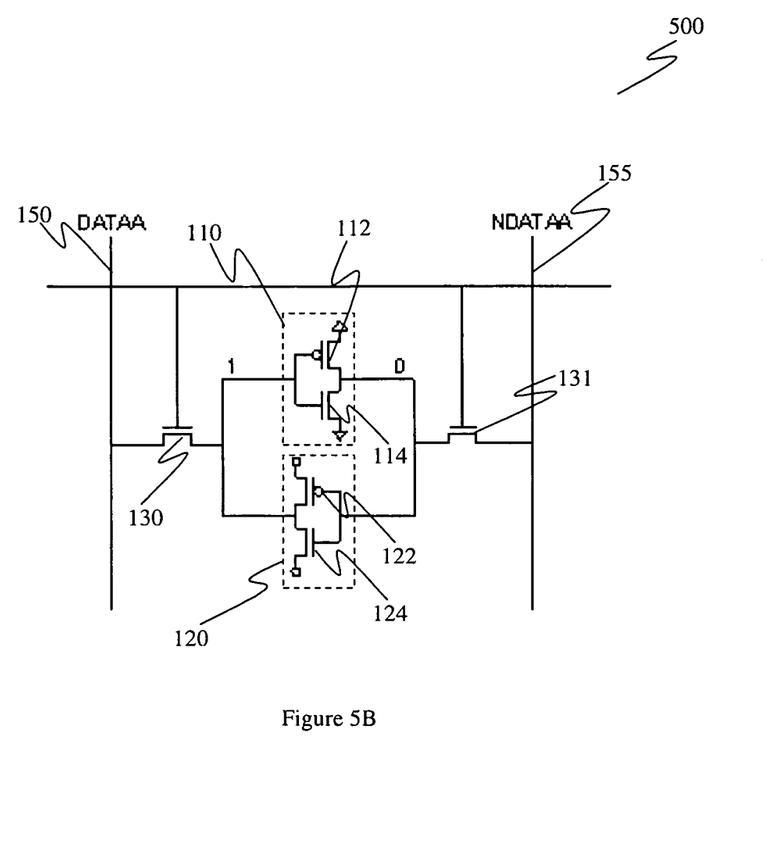
FIG. 5B, meant to be illustrative and not limiting, shows a memory circuit configured as a ROM storing a logic high value without using a pair of programmable switches as an exemplary embodiment of the present invention.

FIGS. 3A and 3B show memory circuit 200 configured as a ROM storing a logic low value and a logic high value, respectively, as exemplary embodiments. Inverters 110 and 120 in each of these embodiments may be disconnected from ground and Vcc to reduce current leakage. In one embodiment, memory circuit 200 may be a circuit in a programmable logic device (PLD). As such, the power supply to both inverters 110 and 120 can be configured by a software application that is used to configure the PLD to perform a desired logic function. That is, a configuration that programs the PLD may set certain configuration RAM bits so that a ground or $V_{cc}$ supply voltage can be applied to the drain or source of the transistors of the back to back inverters as illustrated in FIGS. 5A and 5B. In FIG. 3A, switch 202 is connected to a ground potential and switch 204 is connected to Vcc so that memory circuit 200 carries a logic low value. Conversely, in FIG. 3B, switch 202 is connected to Vcc and switch 204 is connected to a ground potential so that memory circuit 200 carries a logic high value. Therefore, the connection of switches 202 and 204 determines the value stored in memory circuit 200. When switch 202 is connected to a ground potential or GND, as shown in FIG. 3A, memory circuit or memory cell 200 is pulled to GND and a logic low value is transmitted through pass gate 130 to data line 150. When switch 202 is connected to VCC, as shown in FIG. 3B, memory cell 200 is pulled high and a logic high value is transmitted through pass gate 130 to data line 150. Hence, during ROM mode, when switch 202 is connected to Vcc, switch 204 will be connected to GND; and when switch 202 is connected to GND, switch 204 will be connected to Vcc to transmit a complementary value to data line 155 through gate 131.

Figure 3C:
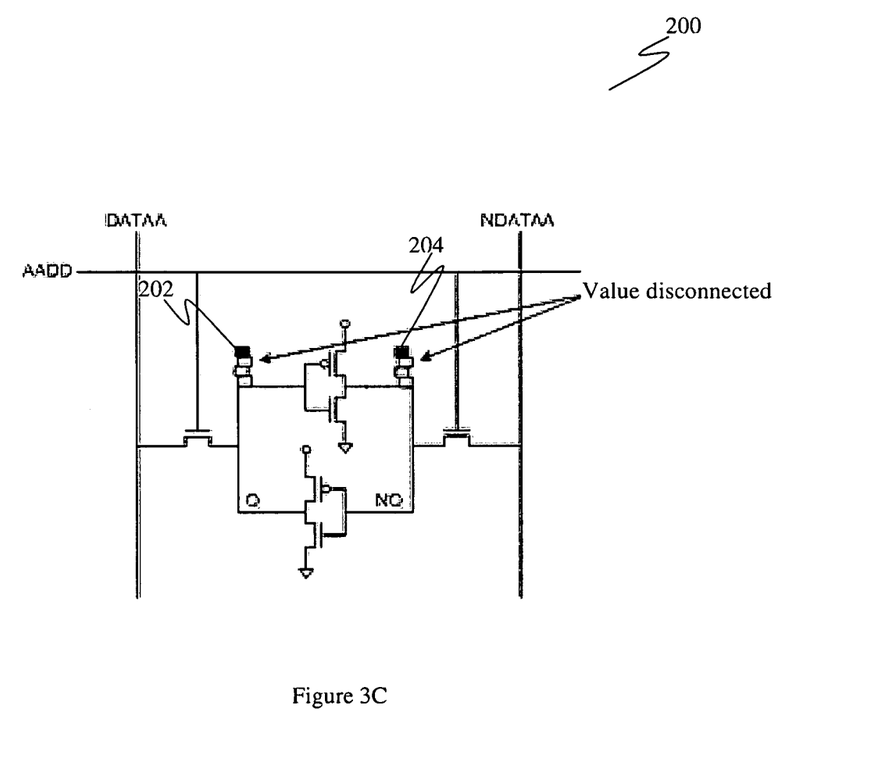
FIG. 3C, meant to be illustrative and not limiting, shows a memory circuit configured as an SRAM as an exemplary embodiment.

FIG. 3C, meant to be illustrative and not limiting, shows memory circuit 200 configured as an SRAM as an exemplary embodiment. Switch 202 and the switch 204 are connected only to memory circuit 200. Unlike in FIGS. 3A and 3B, both switches 202 and 204 are not connected to either Vcc or GND, thereby causing circuit 200 to function as an SRAM. When configured as an SRAM, memory circuit 200 functions as a volatile memory that preserves the data stored in memory circuit 200 as long as power is supplied to the circuit. Values stored in an SRAM can also change. Therefore, since memory circuit 200 is not configured as a ROM that stores a specific value, switch 202 is not connected to any value in order not to always pull memory circuit 200 to a logic high or logic low value. In this way, memory circuit 200 functions essentially like a typical SRAM.

Figure 4:
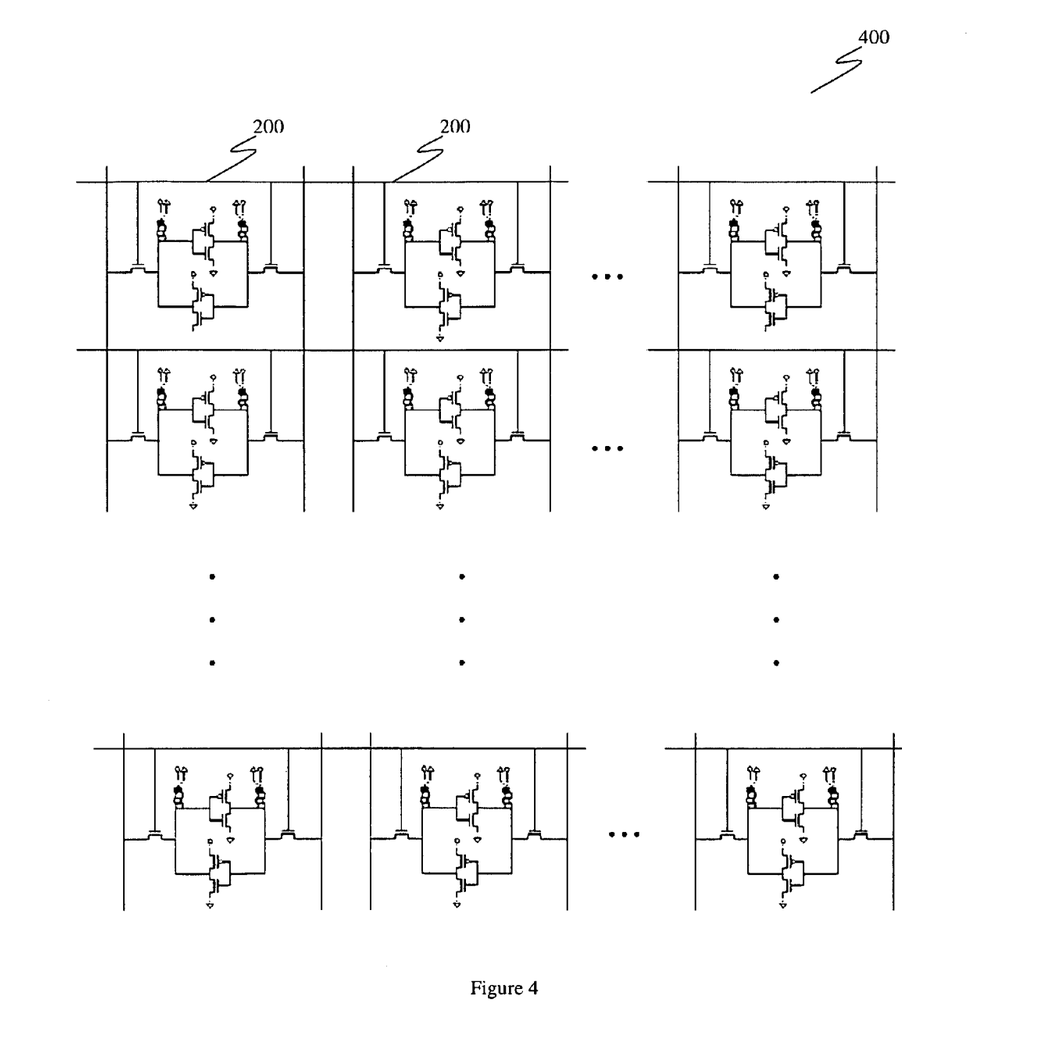
FIG. 4, meant to be illustrative and not limiting, shows an array of memory circuits.

FIG. 4, meant to be illustrative and not limiting, shows a memory circuit array 400. Memory circuit array 400 is made up of one or more coupled memory circuits 200, which were described in connection with FIG. 2. Even though only a few memory circuits 200 are shown in FIG. 4, one skilled in the art should appreciate that any number of memory circuits 200 can be used to form the memory circuit array 400. One or more of the memory circuits 200 in the array 400 can be configured as a ROM storing a logic low value, or a ROM storing a logic high value, or a RAM as described in FIG. 3A, FIG. 3B or FIG. 3C. In one embodiment, all of memory circuits 200 in array 400 are configured either as a ROM or a RAM. In another embodiment, some of memory circuits 200 in array 400 may be configured as ROMs while others may be configured as RAMs, resulting in an array having a combination of the RAM and ROM circuits.

FIG. 5A, meant to be illustrative and not limiting, shows memory circuit 500 configured as a ROM storing a logic low value without using a pair of programmable switches as another embodiment of the present invention. Inverters 110 and 120 have a reconfigurable power supply, i.e., either $V_{CC}$ or $V_{SS}$. To store a logic low value in memory circuit 500 as shown in FIG. 5A, the source of the first PMOS transistor 112 and the drain of the first NMOS transistor 114 are coupled to a ground, e.g., $V_{ss}$, while the source of the second PMOS transistor 122 and the drain of the second NMOS transistor 124 are coupled to a power supply, e.g., $V_{cc}$. Accordingly, the logical high value supplied to the first inverter 110 is inverted to a logical low signal for transmission to line 150 through pass gate 130.

FIG. 5B, meant to be illustrative and not limiting, shows memory circuit 500 configured as a ROM storing a logic high value without using a pair of programmable switches as an exemplary embodiment of the present invention. The source of the first PMOS transistor 112 and the drain of the first NMOS transistor 114 are coupled to a power supply, e.g., $V_{cc}$, while the source of the second PMOS transistor 122 and the drain of the second NMOS transistor 124 are coupled to a ground, e.g., $V_{ss}$. Accordingly, the logical low value supplied to the first inverter 110 is inverted to a logical high signal for transmission to line 150 through pass gate 130. As a result of the embodiments illustrated in FIGS. 5A and 5B, memory circuit 500 may be configured as a ROM circuit that stores either a logic high or logic low value. In one embodiment, the power supply to each transistor of the inverters is configurable through a configuration RAM bit setting or other techniques known in the art. It should be appreciated that the embodiments illustrated with reference to FIGS. 5A and 5B eliminates the need for the programmable metal switches of the previously described embodiments. However, the embodiments of FIGS. 5A and 5B require increased routing in the physical layout, especially in the lower metal layer. Typically, the PMOS and NMOS transistors of the two inverters share the same diffusion and to implement the embodiments of FIGS. 5A and 5B, the diffusion has to be separated between the individual PMOS and NMOS. This, in turn can increase the die area.

Figure 6:
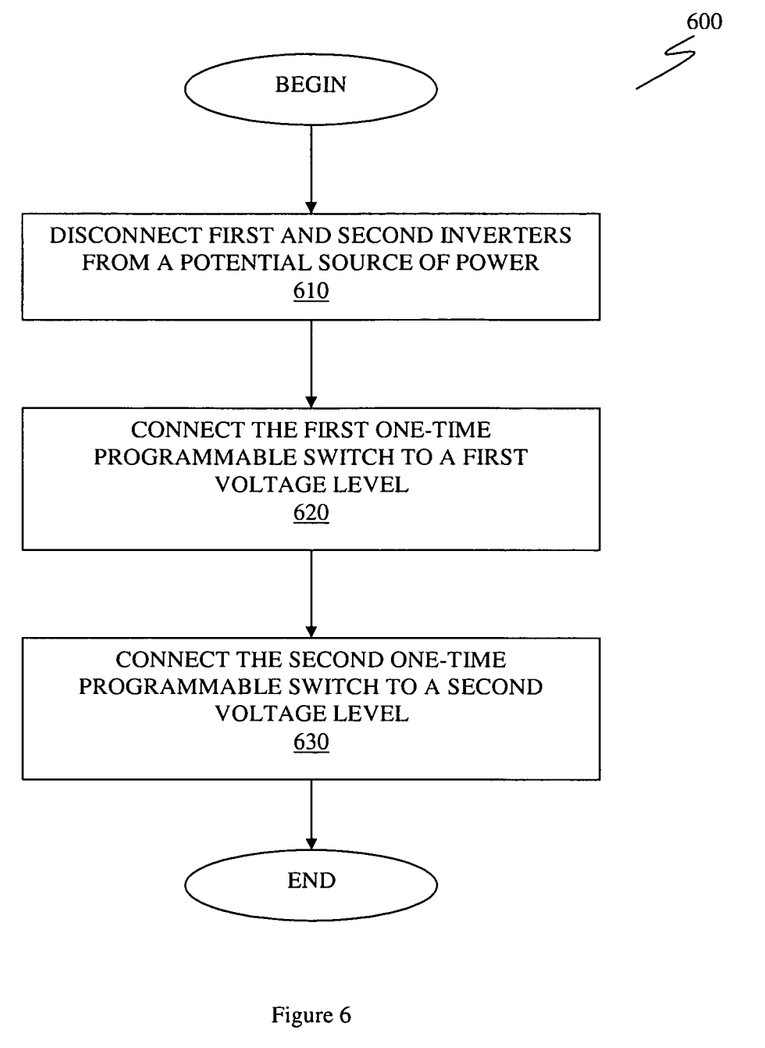
FIG. 6, meant to be illustrative and not limiting, shows a process flow 600 for preparing a memory circuit in accordance with one embodiment of the present invention.

FIG. 6, meant to be illustrative and not limiting, shows a process flow 600 for preparing a memory circuit in accordance with one embodiment of the present invention. In an exemplary embodiment, the memory circuit is either a ROM storing a logic 0 value or a ROM storing a logic 1 value as described in FIG. 3A and FIG. 3B respectively. In operation 610, a first inverter and a second inverter are disconnected from a potential source of power. In one embodiment, the first and second inverters are disconnected from the power supply to reduce current leakage. A first one-time programmable switch is connected to a first voltage level in operation 620. In one embodiment, the first one-time programmable switch corresponds to the switch 202 as described in FIG. 2. A second one-time programmable switch is connected to a second voltage level in operation 630. In some embodiments, the second one-time programmable switch corresponds to the switch 204 as described in FIG. 2. In one embodiment, the read only memory circuit stores a logic low value when the second voltage level is greater than the first voltage level and the read only memory circuit stores a logic high value when the second voltage level is less than the first voltage level. In another embodiment, the first one-time programmable switch is connected to a ground potential and the second one-time programmable switch is connected to a power supply when the read only memory circuit is storing a logic low value. In yet another embodiment, the first one-time programmable switch is connected to a power supply and the second one-time programmable switch is connected to a ground potential when the read only memory circuit is storing a logic high value.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the an of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:
 a first inverter and a second inverter having a first connection and a second connection to each other, the first inverter and the second inverter disconnected from a potential source of power, wherein an output of the first inverter is coupled to an input of the second inverter to form the first connection, wherein an output of the second inverter is coupled to an input of the first inverter to form the second connection, wherein the first inverter comprises a first PMOS transistor and a first NMOS transistor, wherein a gate of the first PMOS transistor and a gate of the first NMOS transistor are coupled to the first connection and wherein a drain of the first PMOS transistor and a drain of the first NMOS transistor are coupled to the second connection;

a first programmable switch coupled to the first connection; and a second programmable switch coupled to the second connection, wherein the first programmable switch is coupled to a first voltage level so that the memory circuit carries a logic low value and coupled to a second voltage level so that the memory circuit carries a logic high value, and the second programmable switch is coupled to the second voltage level so that the memory circuit carries the logic low value and coupled to the first voltage level so that the memory circuit carries the logic high value, wherein each of the first programmable switch and the second programmable switch includes one from a set consisting of a via switch and a metal programmable switch, and wherein both the first programmable switch and the second programmable switch are programmed contemporaneously.

2. The memory circuit of claim 1, wherein the first inverter and second inverter are configured to operate as one of a read only memory that stores a first logic value, a read only memory that stores a second logic value or a random access memory.

3. The memory circuit of claim 1, wherein the memory circuit is a read only memory.

4. The memory circuit of claim 1, wherein the memory circuit stores a first logic value, wherein the second voltage level is greater than the first voltage level.

5. The memory circuit of claim 4, wherein the memory circuit stores a second logic value, wherein the second voltage level is less than the first voltage level.

6. The memory circuit of claim 1, wherein the first and second programmable switches are electrically coupled solely to the first and second connections, respectively, and the memory circuit functions as a random access memory.

7. The memory circuit of claim 1, wherein the second inverter comprises a second PMOS transistor and a second NMOS transistor, wherein a gate of the second PMOS transistor and a gate of the second NMOS transistor are coupled to the second connection and wherein a drain of the second PMOS transistor and a drain of the second NMOS transistor are coupled to the first connection.

8. The memory circuit of claim 1, wherein at least one of: a source of the first PMOS transistor or a source of the second PMOS transistor, is disconnected from a power supply and wherein at least one of: a source of the first NMOS transistor or a source of the second NMOS transistor, is disconnected from a ground potential.

9. The memory circuit of claim 1, wherein the first connection is coupled to a first bit line via a first pass gate and the second connection is coupled to a second bit line via a second pass gate, wherein the first bit line and second bit line generate first output signal and second output signal, respectively.

10. The memory circuit of claim 9, further comprising: an array of memory circuits, and wherein the second output signal is a complement of the first output signal.

11. A memory circuit, comprising:

a first inverter and a second inverter having a first connection and a second connection to each other, wherein the first inverter comprises a first PMOS transistor and a first NMOS transistor wherein a gate of the first PMOS transistor and a gate of the first NMOS transistor are coupled to the first connection and wherein a drain of the first PMOS transistor and a drain of the first NMOS transistor are coupled to the second connection, the second inverter comprising:

a second PMOS transistor and a second NMOS transistor wherein a gate of the second PMOS transistor and a gate of the second NMOS transistor are coupled to the second connection and a drain of the second PMOS transistor and a drain of the second NMOS transistor are coupled to the first connection, wherein the first connection is coupled to a first power level by one from a first set consisting of a via switch and a metal programmable switch, wherein the second connection is coupled to a second power level by one from a second set consisting of a via switch and a metal programmable switch, and wherein at least one of: the first inverter or the second inverter, is disconnected from a potential source of power.

12. The memory circuit of claim 11, wherein the first connection is coupled to a first bit line via a first pass gate and the second connection is coupled to a second bit line via a second pass gate, the first bit line and second bit line are arranged to generate first output signal and second output signal, respectively.

13. The memory circuit of claim 12, wherein the second output signal is a complement of the first output signal.

14. The memory circuit of claim 11, further comprising an array of memory circuits.

15. The memory circuit of claim 11, wherein the first inverter and the second inverter are configured as back-to-back inverters.

16. The memory circuit of claim 11, wherein a first logic value is stored if the first power level is a ground potential and the second power level is a positive power level.

17. The memory circuit of claim 16, wherein a second logic value is stored if the first power level is the positive power level and the second power level is the ground potential.

18. A method of preparing a read only memory circuit comprising:

disconnecting a first inverter and a second inverter from a potential source of power;

coupling a first one-time programmable switch to a first voltage level, wherein the first one-time programmable switch is coupled to a first connection of the first inverter and the second inverter;

coupling a second one-time programmable switch to a second voltage level, wherein the second one-time programmable switch is coupled to a second connection of the first inverter and the second inverter; and programming both the first one-time programmable switch and second one-time programmable switch, wherein the read only memory circuit is operable to store a logic low value if the second voltage level is greater than the first voltage, and wherein the read only memory is operable to store a logic high value if the second voltage level is less than the first voltage.

19. The method of claim 18, wherein the read only memory circuit is integrated into a programmable device.

20. The method of claim 18, wherein the first connection is coupled to a first bit line via a first pass gate and the second connection is coupled to a second bit line via a second pass gate, the first bit line and second bit line operable to generate first output signal and second output signal, respectively, wherein the second output signal is a complement of the first output signal.

* * * * *